(12) United States Patent
Yang et al.

(10) Patent No.: US 7,420,819 B2
(45) Date of Patent: Sep. 2, 2008

(54) EXPANDING HIGH SPEED TRANSPORT INTERFACE HARDWARE METHOD FOR MOTHERBOARD

(75) Inventors: Chi-Wei Yang, Taipei (TW); Sheng-Yuan Tsai, Taipei (TW)

(73) Assignee: Inventec Corporation, Taipei (TW)

( * ) Notice: Subject to any disclaimer, the term of this patent is extended or adjusted under 35 U.S.C. 154(b) by 116 days.

(21) Appl. No.: 11/621,041

(22) Filed: Jan. 8, 2007

(65) Prior Publication Data

US 2007/0112988 A1 May 17, 2007

Related U.S. Application Data

(63) Continuation-in-part of application No. 11/165,631, filed on Jun. 23, 2005, now abandoned.

(51) Int. Cl.
*H05K 7/00* (2006.01)
(52) U.S. Cl. .......................... 361/782; 439/70
(58) Field of Classification Search .............. 439/70; 361/782–785, 802, 804, 803
See application file for complete search history.

(56) References Cited

U.S. PATENT DOCUMENTS 5,440,755 A * 8/1995 Harwer et al. .............. 710/315
5,951,659 A * 9/1999 McElroy et al. ............ 710/300
7,036,027 B2 * 4/2006 Kim et al. ................... 713/300

* cited by examiner

Primary Examiner—Phuong K Dinh
(74) Attorney, Agent, or Firm—Apex Juris, pllc.; Tracy M Heims

(57) ABSTRACT

An expanding high speed transport interface hardware method for motherboard is provided. In the method, a mezzanine card is provided and the mezzanine card has a chip socket. An expanding hardware with high speed transport interface is installed in the chip socket of the mezzanine card. In addition, the mezzanine card is inserted into an idle CPU socket in a motherboard with plural CPU structure to make the mezzanine card electrically connect with the second CPU socket, so that the mezzanine card and the expanding hardware become components of the motherboard. Finally, the motherboard is activated to detect the mezzanine card and the expanding hardware and set the CPU bus as a data transmission path between the mezzanine card and the expanding hardware so as to expand interface hardware for the idle CPU socket. Besides, more design choices and opportunities are provided for the manufacturers of motherboard and peripheral.

7 Claims, 3 Drawing Sheets

EXPANDING HIGH SPEED TRANSPORT INTERFACE HARDWARE METHOD FOR MOTHERBOARD

FIELD OF INVENTION

This application is a continuation-in-part of previously filed application Ser. No. 11/165,631, filed on Jun. 23, 2005 now abandoned. The present invention relates to an expanding interface hardware method, and particularly to an expanding high speed transport interface hardware method for a motherboard.

BACKGROUND OF THE INVENTION

Description of the Related Art

There are several methods to expand hardware for a motherboard. However, the main method uses protocol control information (PCI) or PCI-Express bus slot in the motherboard for expanding hardware. In practice, the PCI bus serves as an interface between a motherboard and a PMC (PCI mezzanine card) module. Since most of I/O functions can be realized through the PCI interface. For example, a display card in a computer is such mezzanine card with a displaying function, which may be inserted onto a connector connected to the PCI bus of the computer mother board.

On the other hand, the PMC providers may only provide PMCs compatible with the connectors provided by the motherboard so that the PMCs may be connected to the PCI bus on the motherboard and function normally. Accordingly, the PMCs to be used may not be selected in their specifications with respect to a specific computer motherboard.

In addition, the motherboard with plural CPU structure requires light in weight and small in size, so the extra space where can be utilized in the motherboard is quite limited. Also, if a customer requires only one CPU, other CPU insertion areas will become idle. In the other words, it is a space resource waste.

SUMMARY OF THE INVENTION

In view of the aforementioned problems, the present invention is directed to providing an expanding high speed transport interface hardware method for a motherboard. To solving the technique problem for prior art, the present invention provides an interface for connecting with PCI bus without through the connector of a motherboard. The present invention provides a method by using a second or a third CPU socket in the motherboard with plural CPU structure to expand high speed transport interface hardware.

To solve the above-mentioned problem, the present invention provides an expanding high speed transport interface hardware method applied to a motherboard with plural CPU structure. Wherein, among the CPU sockets of the motherboard, a CPU bus with high speed transport interface is utilized for connecting each CPU socket.

The method includes the following steps. Firstly, a mezzanine card is provided, and the mezzanine card has a pin grid array disposed on the bottom surface of the mezzanine card. Besides, the top surface of the mezzanine card has a chip socket with high speed transport interface and the chip socket is electrically connected with the pin grid array. Next, an expanding hardware with high speed transport interface is installed in the chip socket. And then the mezzanine card is inserted into an idle CPU socket to make the pin grid array electrically connect with the pin holes of the CPU socket, so that the pin holes of the CPU socket can be electrically connected to the expanding hardware with high speed transport interface through electrically connecting with the CPU bus. Finally, the motherboard is booted and activated. The motherboard will detect the expanding hardware in the mezzanine card and set the CPU bus as a data transmission path so as to add an applicable and new expanding bus interface in the motherboard.

In the above embodiment, the high speed transport interface includes a hyper transport bus interface.

In the above embodiment, the expanding hardware is a bridge chipset, especially an AMD 8131 chipset.

By the connecting mechanism of the present invention, a high speed transport interface hardware can be added. The present invention can be applied to a motherboard with plural CPU sockets. More specific, the present invention is better to be used in a motherboard having an idle CPU socket. Therefore, the idle CPU socket can be used to connect with the mezzanine card of the present invention for expanding a high speed transport interface hardware, so that every CPU socket in the motherboard can be fully utilized. Besides, the expanding hardware is electrically connected to a CPU chip inserted in the motherboard and can be controlled by the CPU chip, so that the inserted CPU chip can also generate an expanding effect by the method of the present invention.

Through the high speed transport interface achieved by the CPU socket of the present invention, many different products may be produced by this method. Therefore, business opportunities are generated.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

Figure 1:
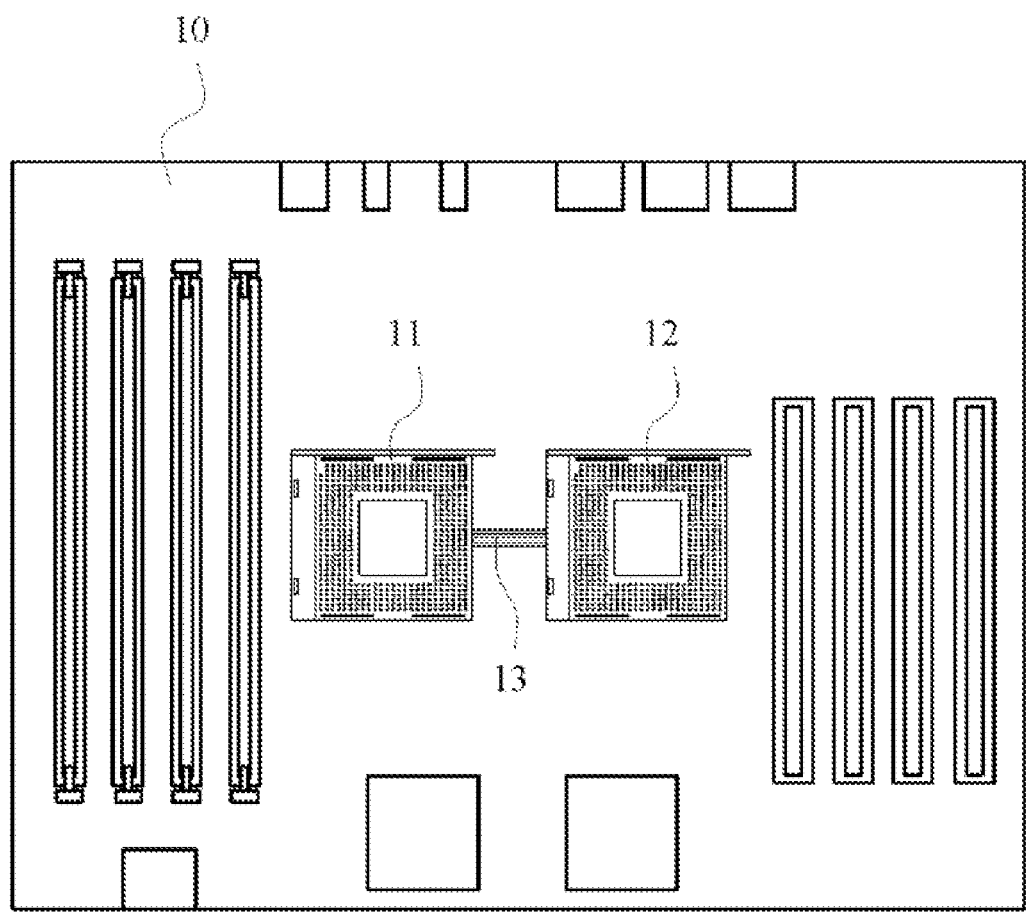
FIG. 1 is a schematic diagram showing a motherboard with plural CPU sockets equipped thereon of the present invention.
Figure 2:
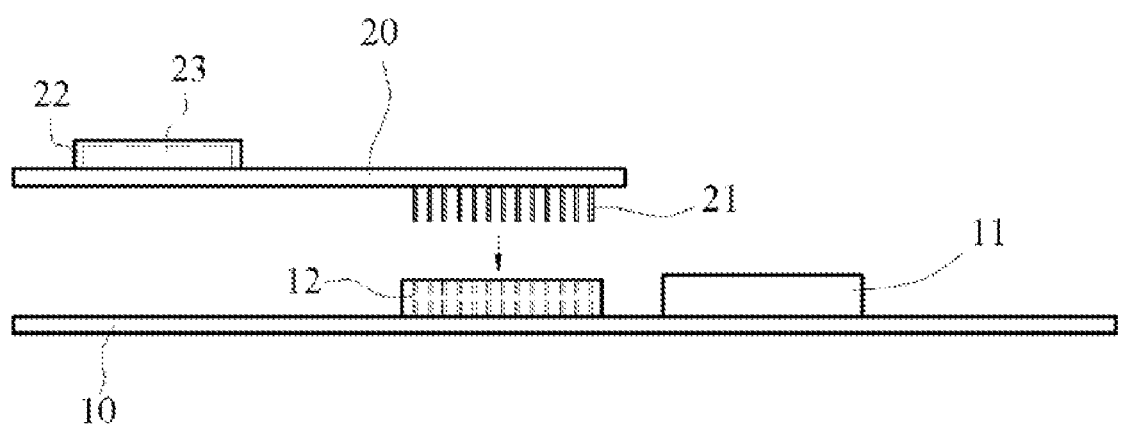
FIG. 2 is a schematic diagram showing a mezzanine card loaded with a high speed transport interface hardware according to a preferred embodiment of the present invention.
Figure 3:
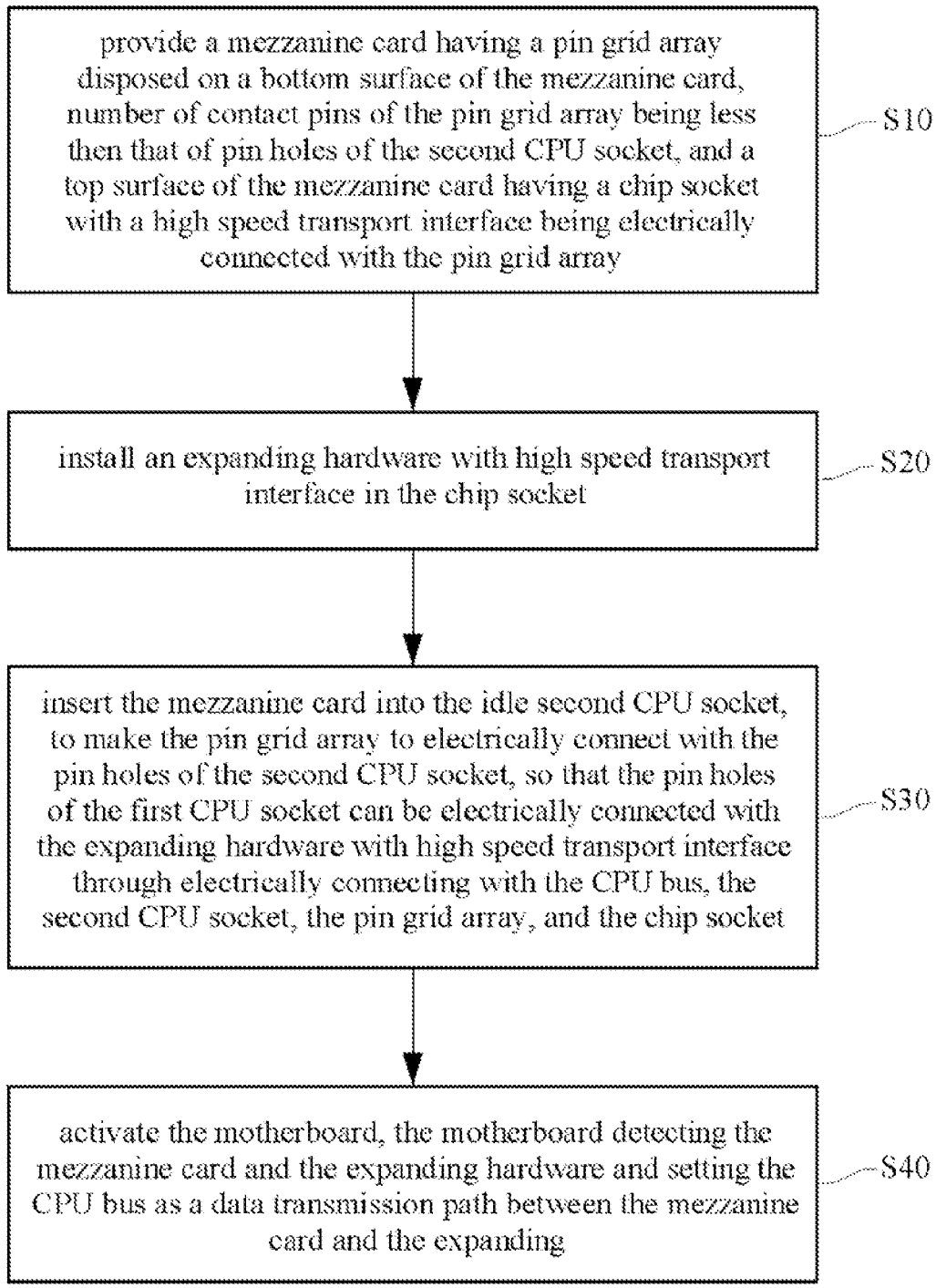
FIG. 3 is a flowchart of expanding high speed transport interface hardware method for a motherboard of the present invention.

As shown in FIGS. 1, 2, and 3, FIG. 1 is a schematic diagram showing a motherboard with plural CPU sockets equipped thereon of the present invention, FIG. 2 is a schematic diagram showing a mezzanine card loaded with a high speed transport interface hardware according to a preferred embodiment of the present invention, and FIG. 3 is a flowchart of expanding high speed transport interface hardware method of the present invention.

The expanding high speed transport interface hardware method for a motherboard of the present invention is applied to a motherboard 10 with plural CPU structure. The motherboard also includes a first CPU socket 11 and a second CPU socket 12. A CPU bus 13 with high speed transport interface is used to connect the first CPU socket 11 and the second CPU socket 12. The high speed transport interface may be a hyper transport bus interface. The method of the present invention comprises the following steps. Firstly, a mezzanine card 20 is provided. The mezzanine card 20 has a pin grid array 21 disposed on the bottom of the mezzanine card 20. The number of contact pins of the pin grid array 21 is less then that of pin holes of the second CPU socket 12. In addition, the top surface of the mezzanine card 20 has a chip socket 22 with high speed transport interface, and the chip socket 22 is electrically connected with the pin grid array 21 (Step S10). Of cause, the required peripheral circuit for matching the expanding hardware 23 inserted in the chip socket 22 is disposed in the mezzanine card 20 in advance. Next, an expanding hardware 23 with high speed transport interface is installed in the chip socket 22 (Step S20). Therefore, the expanding hardware 23 and the peripheral circuit of the mezzanine card 20 can form an integrated circuit. At this time the first CPU socket has inserted with a CPU chip, and then the mezzanine card 20 is inserted into an idle second CPU socket 12 to make the pin grid array 21 electrically connect with the pin holes of the second CPU socket 12, so that the pin holes of the first CPU socket can be electrically connected with the expanding hardware 23 with high speed transport interface through electrically connecting with the CPU bus 13, the pin holes of the second CPU socket 12, the pin grid array 21 of the mezzanine card 20, and the chip socket 22 of the mezzanine card 20 in sequence (Step S30). Finally, the motherboard 10 is booted and activated. The motherboard 10 will detect the expanding hardware 23 in the mezzanine card 20 during the booting procedure. The detected expanding hardware 23 will be registered in the system hardware resource. In addition, the motherboard 10 set the CPU bus 13 as a data transmission path for the expanding hardware 23 (Step S40).

Therefore, the present invention can be applied to a motherboard with plural CPU structure. Especially, when a CPU chip is used in a motherboard with dual CPU socket, the other CPU socket will be idle. At this time, the idled CPU socket can be utilized to provide an additional transport interface by the mezzanine card of the present invention, so that the expanding hardware can be electrically connected to the CPU chip and controlled by the CPU chip. Therefore, the CPU chip can also generate an expanding effect by the method of the present invention, and the space in a notebook can be fully utilized.

In the above embodiment, the first CPU socket 11 is a first order of CPU socket for the motherboard 10. In the other words, the first socket 11 is a main CPU socket and the second socket 12 is a sub CPU socket.

While the preferred embodiments of the invention have been described, it will be apparent to those skilled in the art that various modifications may be made without departing from the spirit of the present invention. Such modifications are all within the scope of the present invention.

What is claimed is:

1. An expanding high speed transport interface hardware method for motherboard, applied to a motherboard having a plural CPU structure, a CPU bus with high speed transport interface being used to connect a first CPU socket and a second CPU socket of the motherboard, the method comprising steps of:
   providing a mezzanine card having a pin grid array disposed on a bottom surface of the mezzanine card, number of contact pins of the pin grid array being less then that of pin holes of the second CPU socket, and a top surface of the mezzanine card having a chip socket with a high speed transport interface being electrically connected with the pin grid array;
   installing an expanding hardware with high speed transport interface in the chip socket;
   inserting the mezzanine card into the idle second CPU socket, to make the pin grid array to electrically connect with the pin holes of the second CPU socket, so that the pin holes of the first CPU socket can be electrically connected with the expanding hardware with high speed transport interface through electrically connecting with the CPU bus, the second CPU socket, the pin grid array, and the chip socket; and
   activating the motherboard, the motherboard detecting the mezzanine card and the expanding hardware and setting the CPU bus as a data transmission path between the mezzanine card and the expanding hardware.

2. The expanding high speed transport interface hardware method for motherboard as claimed in claim 1, wherein the high speed transport interface includes a hyper transport bus interface.

3. The expanding high speed transport interface hardware method for motherboard as claimed in claim 1, wherein the first CPU socket is a first order of CPU socket for the motherboard.

4. The expanding high speed transport interface hardware method for motherboard as claimed in claim 1, wherein the second CPU socket is a first order of CPU socket for the motherboard.

5. The expanding high speed transport interface hardware method for motherboard as claimed in claim 1, wherein signal specification of the chip socket and signal specification of the corresponding pin holes of the second CPU socket are same to each other.

6. The expanding high speed transport interface hardware method for motherboard as claimed in claim 2, wherein hyper transport bus interface includes a bridge chipset.

7. The expanding high speed transport interface hardware method for motherboard as claimed in claim 6, wherein the bridge chip includes an 8131 chipset.

* * * * *